US009099452B2

(12) United States Patent
Cho et al.

(10) Patent No.: US 9,099,452 B2
(45) Date of Patent: Aug. 4, 2015

(54) SEMICONDUCTOR PACKAGE WITH LOW PROFILE SWITCH NODE INTEGRATED HEAT SPREADER

(71) Applicant: International Rectifier Corporation, El Segundo, CA (US)

(72) Inventors: Eung San Cho, Torrance, CA (US); Dan Clavette, Greene, RI (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 14/522,989

(22) Filed: Oct. 24, 2014

(65) Prior Publication Data

US 2015/0130036 A1 May 14, 2015

Related U.S. Application Data

(60) Provisional application No. 61/902,122, filed on Nov. 8, 2013.

(51) Int. Cl.
*H01L 23/00* (2006.01)
*H01L 23/495* (2006.01)
*H01L 21/52* (2006.01)

(52) U.S. Cl.
CPC .......... *H01L 23/49568* (2013.01); *H01L 21/52* (2013.01); *H01L 23/49562* (2013.01)

(58) Field of Classification Search
CPC .................... H01L 2924/00; H01L 23/49575; H01L 2224/73221; H01L 24/34; H01L 23/3107; H01L 23/492
See application file for complete search history.

(56) References Cited

U.S. PATENT DOCUMENTS 8,304,903 B2 11/2012 Herbsommer
2014/0035112 A1* 2/2014 Kadoguchi et al. ........... 257/666
2014/0110776 A1* 4/2014 Cho et al. ..................... 257/329
2014/0118934 A1* 5/2014 Tokuyama et al. ........... 361/689
2015/0001599 A1* 1/2015 Cho ............................ 257/288

* cited by examiner

*Primary Examiner* — Roy Potter
(74) *Attorney, Agent, or Firm* — Farjami & Farjami LLP

(57) ABSTRACT

In one implementation, a semiconductor package includes a patterned conductive carrier including partially etched segments. The semiconductor package also includes a control FET having a control drain attached to a first partially etched segment of the patterned conductive carrier. In addition, the semiconductor package includes a sync FET having a sync source and a sync gate attached to respective second and third partially etched segments of the patterned conductive carrier. The semiconductor package further includes a heat spreading conductive plate situated over a control source of the control FET and over a sync drain of the sync FET so as to couple the control source and the sync drain to a switch node segment of the patterned conductive carrier.

20 Claims, 8 Drawing Sheets

SEMICONDUCTOR PACKAGE WITH LOW PROFILE SWITCH NODE INTEGRATED HEAT SPREADER

The present application claims the benefit of and priority to a provisional application entitled "Multi-Chip Module Including Switch Node Contact Integrated Heat Spreader," Ser. No. 61/902,122, filed on Nov. 8, 2013. The disclosure in this provisional application is hereby incorporated fully by reference into the present application.

BACKGROUND

Background Art

Voltage converters are used in a variety of electronic circuits and systems. Semiconductor packaging solutions for voltage converters must typically be configured to accommodate power transistors in voltage converters, sometimes referred to as control and sync transistors, as well as the high current switch node connection between the control and sync transistors. In conventional voltage converter packages, the switch node connection between the control and sync transistors is typically implemented using a conductive clip, such as a copper clip including a conductive body and a conductive support leg. Because the control and sync transistors can be very sensitive to electrical resistance, the cross-sectional area of the conductive clip used to provide the switch node need be relatively large to provide a reliable, low resistance connection under high current conditions.

However, as advances in technology enable implementation of ever thinner control and sync transistors, conventional use of a conductive clip to provide the switch node connection between the control and sync transistors becomes increasingly problematic. For example, although use of thinner control and sync transistors can, in principle, advantageously enable significant reductions in package height, the permissible thickness of the conductive body portion of a conventional conductive clip is typically limited by the height of its support leg. As a result, a conventional conductive clip is unable to scale with the thinner control and sync transistors with which it is typically packaged, thereby resulting in a semiconductor package that is undesirably oversized for the power transistors it contains.

SUMMARY

The present disclosure is directed to a semiconductor package with low profile switch node integrated heat spreader, substantially as shown in and/or described in connection with at least one of the figures, and as set forth more completely in the claims.

DETAILED DESCRIPTION

Figure 1A:
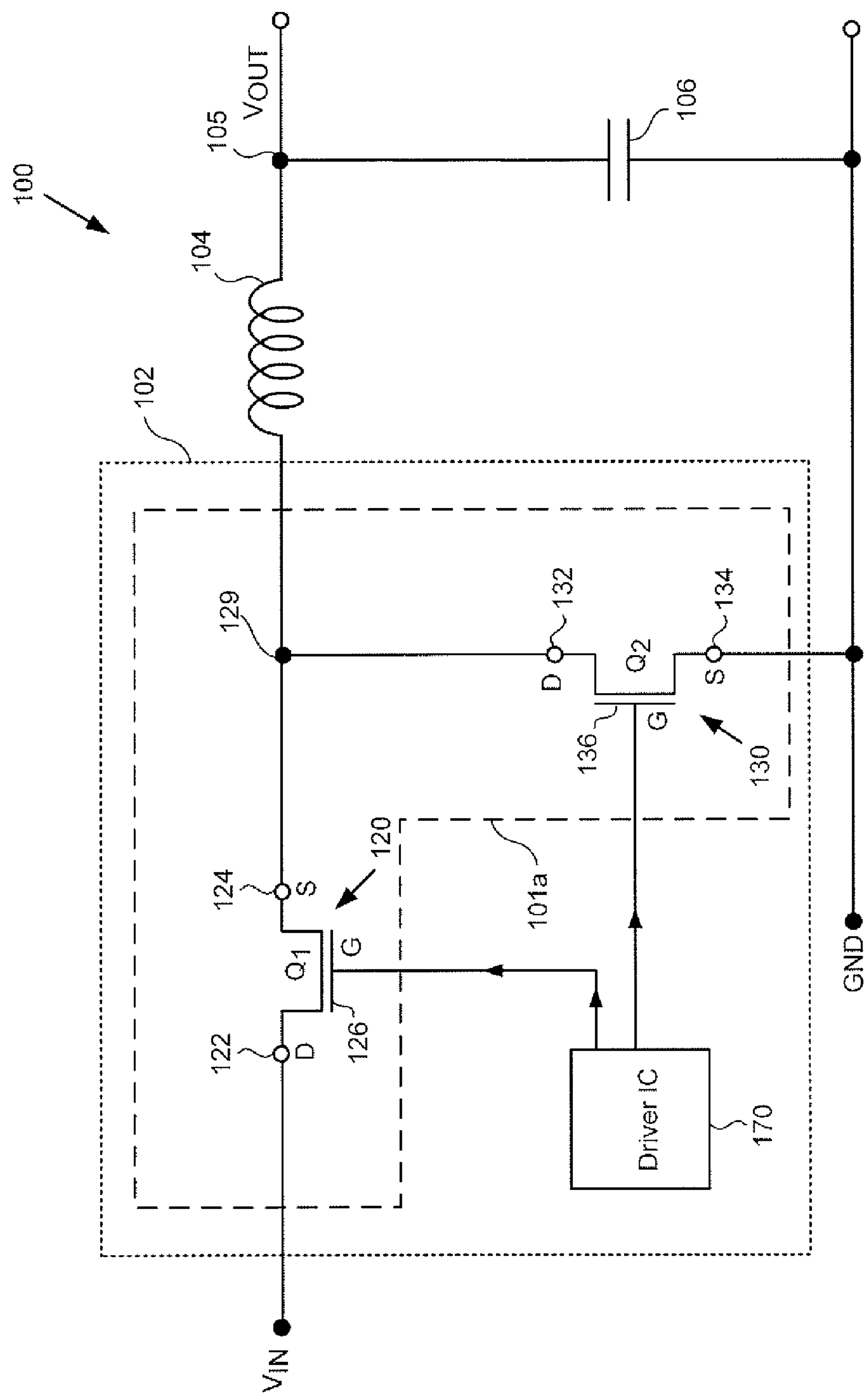
FIG. 1A shows a diagram of an exemplary circuit suitable for use as a voltage converter.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Power converters, such as voltage regulators, are used in a variety of electronic circuits and systems. For instance, integrated circuit (IC) applications may require conversion of a direct current (DC) input to a lower, or higher, DC output. As a specific example, a buck converter may be implemented as a voltage regulator to convert a higher voltage DC input to a lower voltage DC output for use in low voltage applications in which relatively large output currents are required.

FIG. 1A shows a diagram of an exemplary circuit suitable for use as a voltage converter. Voltage converter 100 includes voltage converter multi-chip module (MCM) 102, output inductor 104, and output capacitor 106. As shown in FIG. 1A, voltage converter MCM 102 includes power switching stage 101*a* of voltage converter 100, and driver IC 170 implemented to provide drive signals to power switching stage 101. As further shown in FIG. 1A, voltage converter 100 is configured to receive an input voltage $V_{IN}$, and to provide a converted voltage, e.g., a rectified and/or stepped down voltage, as $V_{OUT}$ at output 105.

Power switching stage 101*a* may be implemented using two power switches in the form of metal-oxide-semiconductor field-effect transistors (MOSFETs) configured as a half bridge, for example. That is to say, power switching stage 101*a* may include high side or control FET 120 ($Q_1$) having drain 122, source 124, and gate 126, as well as low side or sync FET 130 ($Q_2$) having drain 132, source 134, and gate 136. Control FET 120 is coupled to sync FET 130 at switch node 129, which, in turn, is coupled to output 105 through output inductor 104. Respective control and sync FETs 120 and 130 may be implemented as group IV based power FETs, such as silicon power MOSFETs having a vertical design, for example. Voltage converter 100 may be advantageously utilized, for example as a buck converter, in a variety of automotive, industrial, appliance, and lighting applications.

Figure 1B:
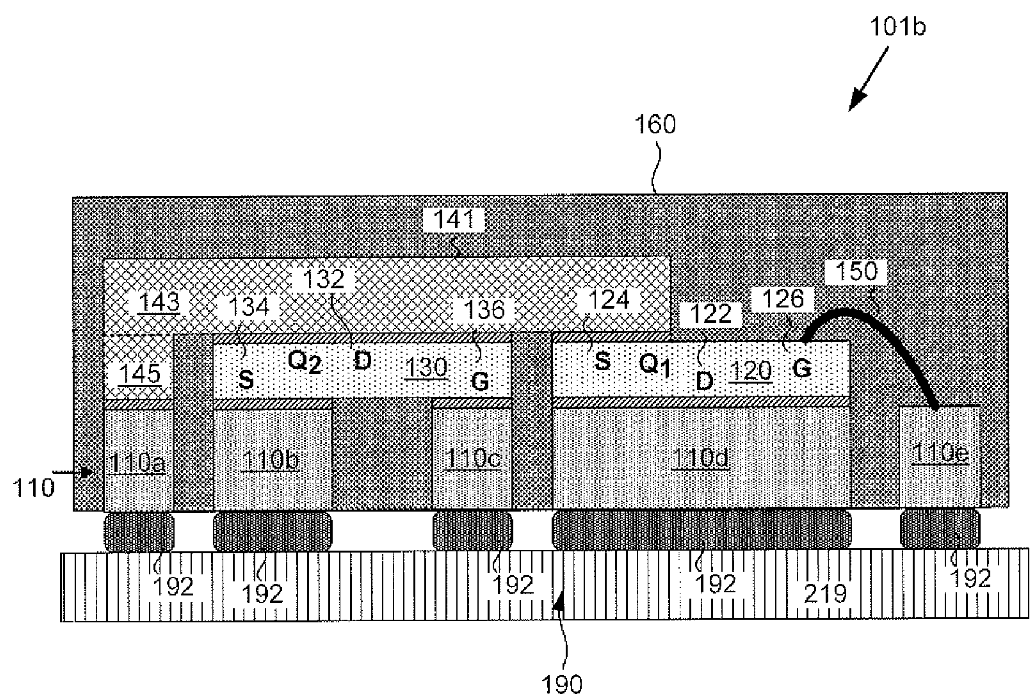
FIG. 1B shows a conventional packaging solution for some elements of the exemplary circuit of FIG. 1A.

FIG. 1B shows a conventional packaging solution for some elements of the exemplary circuit of FIG. 1A. Conventional semiconductor package 101*b* is shown in FIG. 1B to be attached to mounting surface 190, which may be a printed circuit board (PCB) for example, by solder bodies 192. Conventional semiconductor package 101*b* includes lead frame 110 having lead frame sections 110*a*, 110*b*, 110*c*, 110*d*, and 110*e* (hereinafter "lead frame sections 110*a*-110*e*").

As shown in FIG. 1B, semiconductor package 101*b* also includes control FET 120 ($Q_1$) having drain 122, source 124, and gate 126, as well as sync FET 130 ($Q_2$) having drain 132, source 134, and gate 136. As further shown in FIG. 1B, source 124 of control FET 120 is connected to drain 132 of sync FET 130 by conductive clip 141 having conductive body 143 and vertical conductive support leg 145. By electrically connecting source 124 of control FET 120 to drain 132 of sync FET 130, conductive clip 141 serves as the switch node connection for semiconductor package 101*b*. Also shown in FIG. 1B are wire bond 150 coupling gate 126 of control FET 120 to lead frame section 110*e*, and overmolding or encapsulation material 160 for semiconductor package 101*b*.

Semiconductor package 101*b* corresponds to power switching stage 101*a* in FIG. 1. In addition, control FET 120 having drain 122, source 124, and gate 126, and sync FET 130 having drain 132, source 134, and gate 136 are shown as corresponding features in FIGS. 1A and 1B. Moreover, conductive clip 141 providing the switch node connection in semiconductor package 101*b* of FIG. 1B, corresponds in general to switch node 129 of power switching stage 101*a*, in FIG. 1A.

As noted above, a conventional conductive clip used to provide a switch node connection, such as conductive clip 141 in FIG. 1B, must be sufficiently robust to accommodate high current. Moreover, because control and sync FETs 120 and 130 can be very sensitive to electrical resistance, the cross-sectional area of conductive clip 141 need be relatively large. However, as advances in technology enable implementation of ever thinner power transistors as control and sync FETs 120 and 130, attempts to implement conventional conductive clip 141 as a switch node connection gives rise to conflicting constraints.

For example, the permissible thickness of conductive body 143 of conductive clip 141 is typically limited by the height of conductive support leg 145. As control and sync FETs 120 and 130 are implemented using ever thinner transistors, conductive support leg 145 must necessarily have a reduced height to properly position conductive body 143 for contact with control and sync FETs 120 and 130. The resulting limitation on the thickness of conductive body 143 imposed by the reduction in height of conductive support leg 145 results in a reduction of the effective cross-sectional area of conductive clip 141, which can undesirably impair its high current performance.

Moreover, power switches such as control and sync FETs 120 and 130 are capable of generating substantial heat during operation. In conventional packaging solutions, the potentially damaging heat is typically diverted away from control and sync FETs 120 and 130 using a heat spreader (not shown in FIG. 1B), which is often relatively large. Consequently, conventional packaging solutions for power switching stage 101*a* and/or MCM 102, in FIG. 1A, must typically be sized to accommodate not only control and sync FETs 120 and 130, but large conductive clip 141 providing their switch node connection, and often a large heat spreader providing thermal protection for control and sync FETs 120 and 130 as well.

The present application discloses a packaging solution enabling omission of the aforementioned conductive clip, while providing a reliable, low resistance, and substantially parasitic free electrical connection for establishing switch node 129, in FIG. 1A. In one implementation, a switch node connection according to the present inventive principles can be implemented using a substantially flat, heat spreading conductive plate, which can concurrently provide thermal protection for control and sync FETs 120 and 130. Moreover, by using a substantially flat heat spreading conductive plate to provide integrated heat spreading and switch node connection functionality, the present packaging solution enables implementation of a highly compact semiconductor package.

Figure 2:
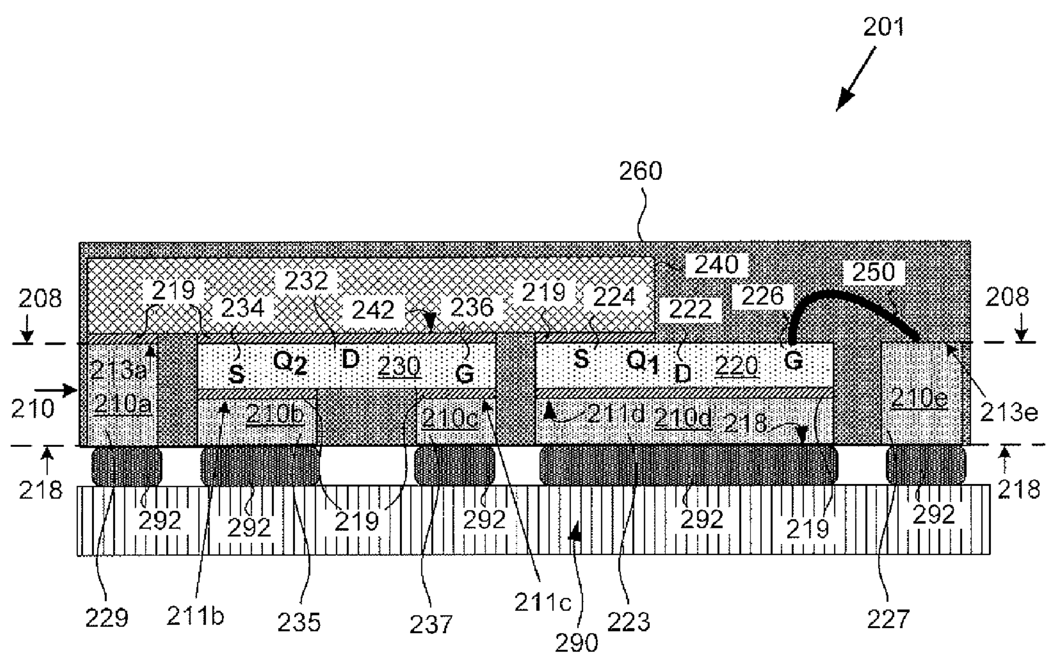
FIG. 2 shows an exemplary representation of a packaging solution according to one implementation of the present disclosure.

FIG. 2 shows an exemplary packaging solution according to one implementation of the present disclosure. FIG. 2 presents a cross-sectional view of semiconductor package 201 attached to mounting surface 290, which may be a PCB for example, by solder bodies 292. Semiconductor package 201 includes patterned conductive carrier 210, which itself includes conductive carrier segments 210*a*, 210*b*, 210*c*, 210*d*, and 210*e* (hereinafter "segments 210*a*-210*e*"). It is noted that patterned conductive carrier 210 includes partially etched segments 210*b*, 210*c*, and 210*d*, which may be half-etched, for example, as well as segments 210*a* and 210*e*, which may be substantially non-etched. It is further noted that in some implementations, segment 210*e* may be a partially etched segment analogous to partially etched segments 210*b*, 210*c*, and 210*c*1.

As shown in FIG. 2, patterned conductive carrier 210 may be a non-contiguous conductive carrier, made up of patterned and disjointed segments 210*a*-210*e* that are housed within semiconductor package 201, and that are in electrical communication only through conductive traces and routing on or within mounting surface 290. As further shown in FIG. 2, conductive carrier 210 has die receiving side 208, and opposite input/output (I/O) side 218 connecting semiconductor package 201 to mounting surface 290.

Semiconductor package 201 also includes control FET 220 ($Q_1$) having drain 222, source 224, and gate 226, as well as sync FET 230 ($Q_2$) having drain 232, source 234, and gate 236. It is noted that in the interests of ease and conciseness of description, the present inventive principles will in some instances be described by reference to specific implementations of a buck converter including one or more silicon based power FETs. Thus, control and sync FETs 220 and 230 are specific examples of power transistors used for illustrative purposes in the present application. However, it is emphasized that such implementations are merely exemplary, and the inventive principles disclosed herein are broadly applicable to a wide range of applications, including buck and boost converters, implemented using other group IV material based, or group III-V semiconductor based, power transistors.

It is further noted that as used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power transistor may be fabricated using gallium nitride (GaN), in which the group III element or elements include some or a substantial amount of gallium, but may also include other group III elements in addition to gallium.

As shown in FIG. 2, drain 222 of control FET 220 is attached to surface 211*d* on die receiving side 208 of partially etched segment 210*d* by electrically conductive die attach material 219. In addition, source 234 and gate 236 of sync FET 230 are similarly attached to respective surfaces 211*b* and 211*c* on die receiving side 208 of respective partially etched segments 210_b_ and 210_c_. Also shown in FIG. 2 is heat spreading conductive plate 240. Heat spreading conductive plate 240 is attached to source 224 of control FET 220, drain 232 of sync FET 230, and surface 213_a_ on die receiving side 208 of segment 210_a_ of patterned conductive carrier 210 by electrically conductive die attach material 219. By coupling source 224 of control FET 220 to drain 232 of sync FET 230, heat spreading conductive plate 240 serves as the switch node connection for semiconductor package 201.

Also included as part of semiconductor package 201 are drain contact 223 provided by partially etched segment 210_d_, source contact 235 provided by partially etched segment 210_b_, gate contacts 227 and 237 provided by respective segment 210_e_ and partially etched segment 210_c_. In addition segment 210_a_ of patterned conductive carrier 210 (hereinafter "switch node segment 210_a_") and heat spreading conductive plate 240 provide switch node contact 229 of semiconductor package 201.

It is noted that switch node segment 210_a_ and heat spreading conductive plate 240 are configured to provide switch node contact 229 while concurrently providing integrated heat spreading functionality for dissipation of heat generated by control and sync FETs 220 and 230. It is further noted that in addition to providing drain contact 223, partially etched segment 210_d_ is configured to sink heat produced by control FET 220 into mounting surface 290, while partially etched segment 210_b_ is configured to sink heat produced by sync FET 230 into mounting surface 290, as well as to provide source contact 235. Also shown in FIG. 2 are one or more bond wires 250 coupling gate 226 of control FET 220 to surface 213_e_ on die receiving side 208 of segment 210_e_ of patterned conductive carrier 210, and overmolding or encapsulation material 260 for semiconductor package 201.

Semiconductor package 201 corresponds in general to power switching stage 101 in FIG. 1A. In addition, control FET 220 having drain 222, source 224, and gate 226, and sync FET 230 having drain 232, source 234, and gate 236, correspond in general to control FET 120 having drain 122, source 124, and gate 126, and sync FET 130 having drain 132, source 134, and gate 136, respectively, in FIG. 1A. Moreover, switch node contact 229, in FIG. 2, corresponds to switch node 129, in FIG. 1A.

The features of semiconductor package 201 will be described in greater detail by reference to FIG. 3, and FIGS. 4A, 4B, 4C, 4D, and 4E (hereinafter "FIGS. 4A-4E"). However, it is noted in reference to FIG. 2 that the electrical connection between source 224 of control FET 220 and drain 232 of sync FET 230 is established in the absence of a conventional conductive clip. Instead, according to the implementation shown in FIG. 2, the electrical connection between source 224 and drain 232 providing switch node contact 229 is advantageously provided by heat spreading conductive plate 240. As a result, the packaging solution of FIG. 2 provides a robust, low resistance, and low parasitic connection for providing switch node contact 229. Moreover, the inventive concepts disclosed by the packaging solution represented in FIG. 2 can be extended to enable the fabrication of high density MCM packages, with reduced parasitics and improved thermal performance.

Figure 3:
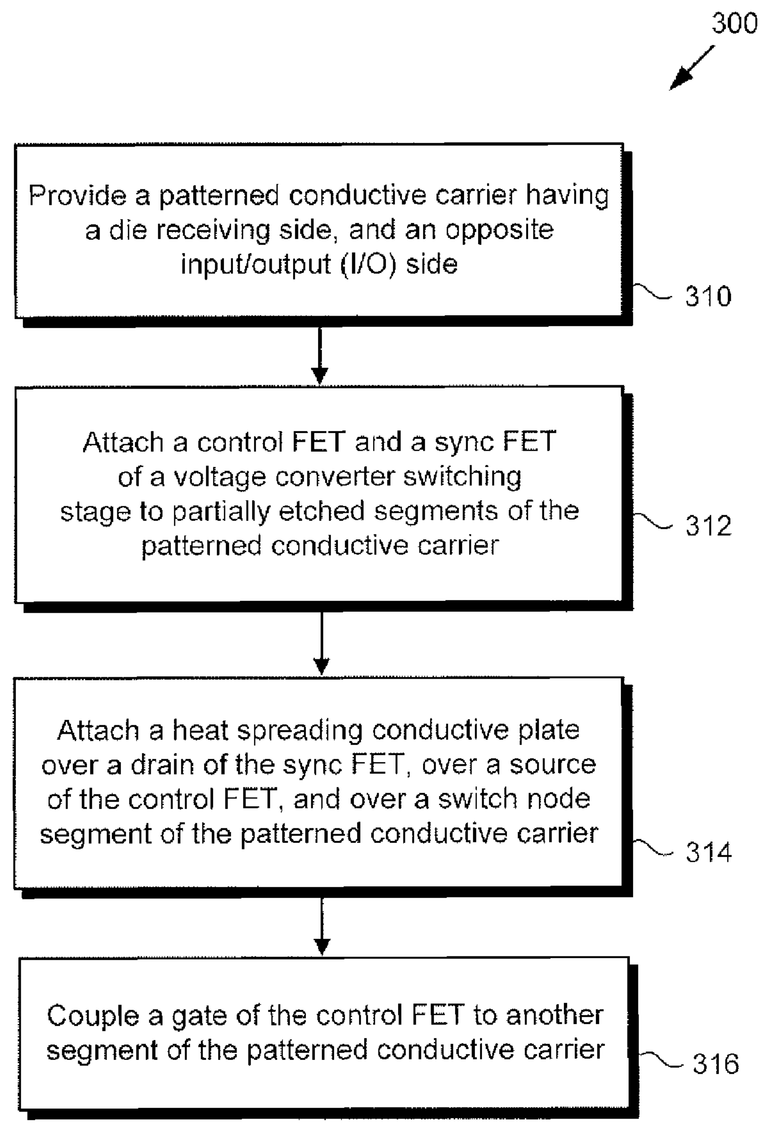
FIG. 3 shows a flowchart presenting an exemplary method for fabricating a semiconductor package according to one implementation of the present disclosure.

Referring to FIG. 3, FIG. 3 shows flowchart 300 presenting an exemplary method for fabricating a semiconductor package according to one implementation of the present disclosure. It is noted that the method described by flowchart 300 is performed on a portion of a conductive carrier structure, which may be a semiconductor package lead frame, or may take the form of a conductive sheet or plate, for example.

Figure 4A:
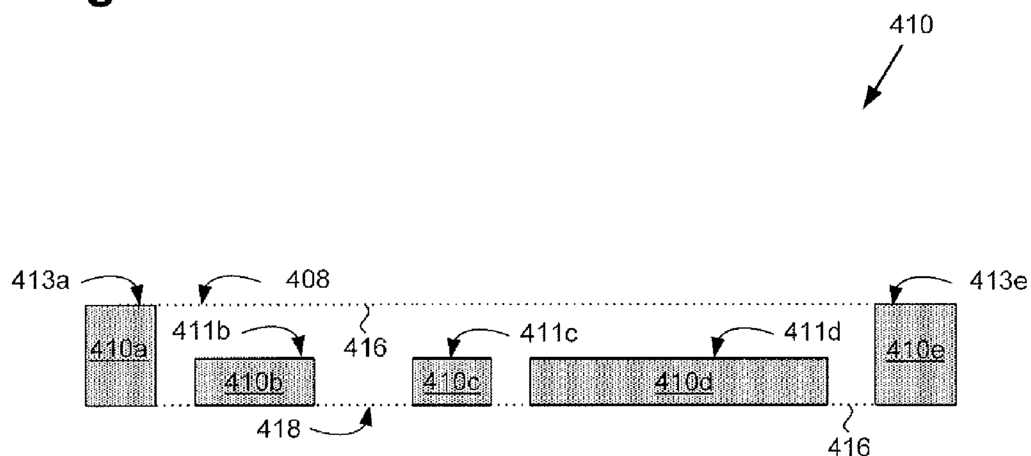
FIG. 4A illustrates a result of performing of an initial action according to the flowchart of FIG. 3 in accordance with one implementation of the present disclosure.

With respect to FIGS. 4A-4D, structures 410 through 414 shown respectively in those figures illustrate the result of performing the method of flowchart 300 according to one implementation of the present disclosure. For example, FIG. 4A represents patterned conductive carrier 410 including segments 410_a_, 410_b_, 410_c_, 410_d_, and 410_e_ (hereinafter "segments 410_a_-410_e_") having die receiving side 408 and opposite I/O side 418 (action 310), structure 412 shows patterned conductive carrier 410 after attachment of a control FET and a sync FET to partially etched segments 410_d_, 410_b_, and 410_c_ (action 312), structure 414 shows structure 412 after attachment of a heat spreading conductive plate (action 314), and so forth. It is noted that FIG. 4E shows an alternative implementation of the structure shown in FIG. 4D. It is further noted that patterned conductive carrier 410 including segments 410_a_-410_e_, in FIGS. 4A through 4E, corresponds to patterned conductive carrier 210 including segments 210_a_-210_e_, in FIG. 2.

Referring to flowchart 300, in FIG. 3, in combination with FIG. 4A, flowchart 300 begins with providing patterned conductive carrier 410 having die receiving side 408, and opposite I/O side 418 (action 310). As shown in FIG. 4A, patterned conductive carrier 410 may be a fully patterned conductive carrier including conductive carrier segments 410_a_-410_e_. As further shown in FIG. 4A, patterned conductive carrier 410 is shown to have surfaces 413_a_ and 413_e_ on respective segments 410_a_ and 410_e_, as well as surfaces 411_b_, 411_c_, and 411_d_ on respective partially etched segments 410_b_, 410_c_, and 410_d_.

It is noted that due to the partial etching of partially etched segments 410_b_, 410_c_, and 410_d_, surfaces 411_b_, 411_c_, and 411_d_, are recessed on die receiving side 408 relative to surfaces 413_a_ and 413_e_. It is further noted that partially etched segments 410_b_, 410_c_, and 410_d_ may be half-etched, while segments 410_a_ and 410_e_ may be substantially non-etched. It is also noted that in some implementations, segment 410_e_ may be a partially etched segment analogous to partially etched segments 410_b_, 410_c_, and 410_d_. As stated above, patterned conductive carrier 410 including segments 410_a_-410_e_, in FIGS. 4A-4D and FIG. 4E corresponds to conductive carrier 210 including segments 210_a_-210_e_, in FIG. 2.

It is noted that segments 410_a_-410_e_ are shown as connected by dashed lines 456 to indicate that the gaps between those respective sections may be visible in FIGS. 4A-4D and 4E due to patterning of an initially contiguous conductive carrier structure providing patterned conductive carrier 410. That is to say, patterned conductive carrier 410 may be provided by a single conductive carrier support structure, fully patterned to provide segments 410_a_-410_e_. Patterned conductive carrier 410 may be formed of any conductive material having a suitably low electrical resistance. Examples of materials from which patterned conductive carrier 410 may be formed include copper (Cu), aluminum (Al), or a conductive alloy. In one implementation, as noted above, patterned conductive carrier 410 may be implemented using a single semiconductor package lead frame.

Recessed surfaces 411_b_, 411_c_, and 411_d_ on die receiving side 408 of patterned conductive carrier 410 may be the result of a partial etch performed on die receiving side 408, resulting in formation of partially etched segments 410_b_, 410_c_, and 410_d_. In one implementation, for example, surfaces 411_b_, 411_c_, and 411_d_ may be produced by performing a half-etch of portions of patterned conductive carrier 410, on die receiving side 408, to form half-etched segments corresponding to partially etched segments 410_b_, 410_c_, and 410_d_.

Although not shown in the present figures, in some implementations, patterned conductive carrier 410 may include a barrier metal layer formed on one or both of die receiving side 408 and I/O side 418. Such a barrier metal layer may be formed of nickel-gold (NiAu) or nickel-palladium-gold (NiPdAu), for example. In some implementations, such a barrier metal layer may serve as an etching mask during patterning of patterned conductive carrier 410.

Figure 4B:
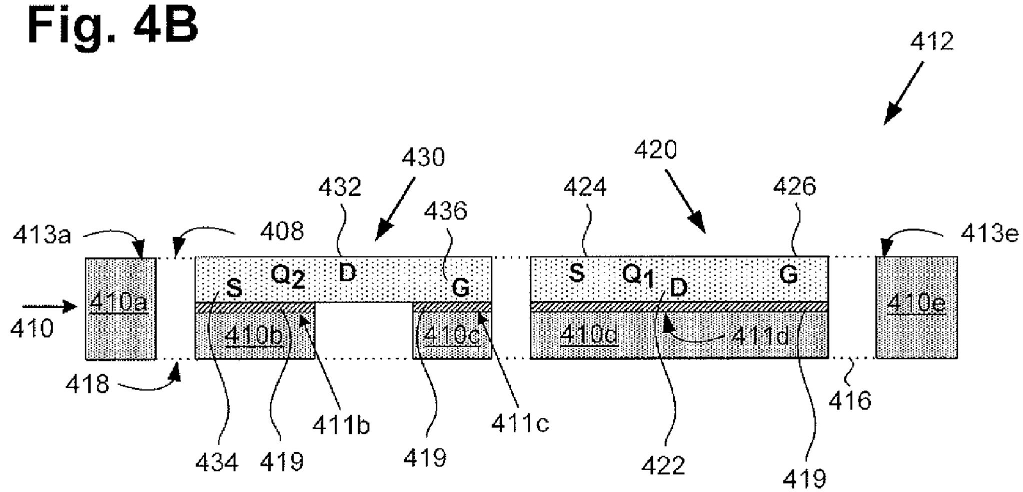
FIG. 4B illustrates a result of performing of a subsequent action according to the flowchart of FIG. 3 in accordance with one implementation of the present disclosure.

Moving to structure 412 in FIG. 4B with ongoing reference to FIG. 3, flowchart 300 continues with attaching control FET 420 ($Q_1$) and sync FET 430 ($Q_2$) to partially etched segments of patterned conductive carrier 410 (action 312). Control FET 420 includes drain 422, source 424, and gate 426, while sync FET 430 includes drain 432, source 434, and gate 436. As shown in FIG. 4B, drain 422 of control FET 420 is attached to surface 411*d* on die receiving side 408 of partially etched segment 410*d* by electrically conductive die attach material 419. As further shown in FIG. 4B, source 434 and gate 436 of sync FET 430 are attached to surfaces 411*b* and 411*c* on die receiving side 408 of respective partially etched segments 410*b* and 410*c* by electrically conductive die attach material 419.

Electrically conductive die attach material 419 may be any suitable substance, such as a conductive epoxy, solder, a conductive sintered material, or a diffusion bonded material, formed to a thickness of approximately 10 μm or greater, for example. Control FET 420 and sync FET 430 are shown as power FETs having a vertical topology. That is to say, source 424 and gate 426 are situated on the same side of control FET 420, while drain 422 is situated on an opposite side of control FET 420. Similarly, source 434 and gate 436 are situated on the same side of sync FET 430, while drain 432 is situated on an opposite side of sync FET 430.

In one implementation, respective control and sync FETs 420 and 430 may take the form of group IV material based vertical FETs, such as silicon vertical MOSFETs for example. However, in other implementations, respective control and sync FETs 420 and 430 may take the form of group III-V based power FETs, such as GaN or other III-Nitride based FETs.

It is noted that control FET 420 and sync FET 430 are flipped relative to each other. That is to say, control FET 420 is disposed on surface 411*d* of partially etched segment 410*d* in a "face up" orientation in which drain 422 is attached to surface 411*d*, while sync FET 430 is oriented "face down" such that source 434 and gate 436 are attached to surfaces 411*b* and 411*c* of respective partially etched segments 410*c* and 410*b*. It is further noted that control and sync FETs 420 and 430 may be attached to patterned conductive carrier 410 in any temporal order. Thus, control FET 420 may be attached to patterned conductive carrier 410 before or after attachment of sync FET 430 to patterned conductive carrier. Moreover, in some implementations, control and sync FETs 420 and 430 may be attached to patterned conductive carrier 410 substantially concurrently. Control FET 420, sync FET 430, and electrically conductive die attach material 419 correspond respectively to control FET 220, sync FET 230, and electrically conductive die attach material 219, in FIG. 2.

Figure 4C:
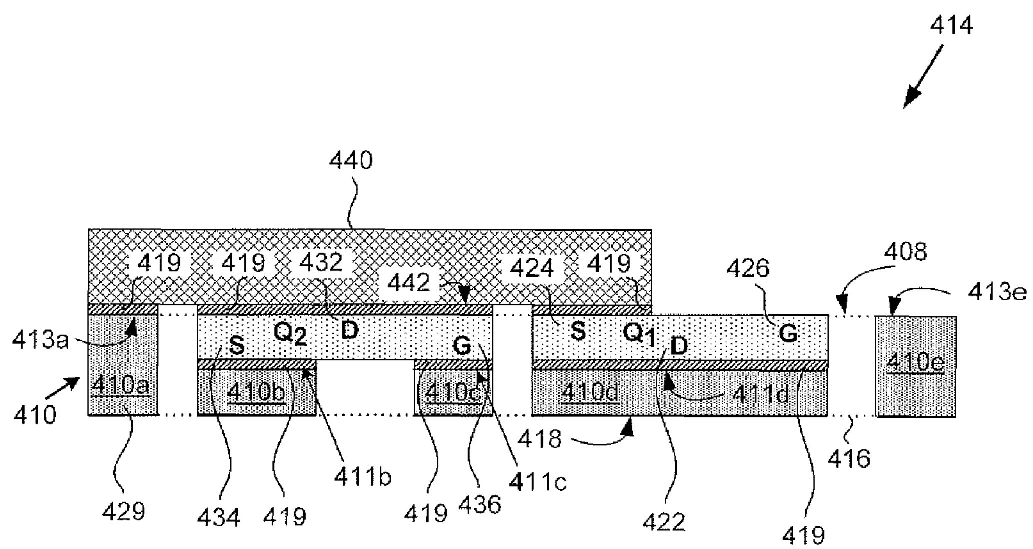
FIG. 4C illustrates a result of performing of a subsequent action according to the flowchart of FIG. 3 in accordance with one implementation of the present disclosure.

As shown by structure 414 in FIG. 4C, flowchart 300 continues with attaching heat spreading conductive plate 440 over source 424 of control FET 420, over drain 432 of sync FET 430, and over switch node segment 410*a* of patterned conductive carrier 410 (action 314). According to the implementation shown in FIG. 4C, heat spreading conductive plate 440 may be a substantially flat electrically and thermally conductive body having a substantially planar contact surface for attachment to control FET 420, sync FET 430, and switch node segment 410*a*. As a result, source 424, drain 432, and surface 413*a* of switch node segment 410*a*, which may be a top surface of switch node segment 410*a*, may be substantially coplanar.

Heat spreading conductive plate 440 may be formed of a metal such as Cu or Al, for example, or may be formed from a conductive alloy. As shown in FIG. 4C, heat spreading conductive plate 440 can be attached to source 424, drain 432, and surface 413*a* of switch node segment 410*a* using electrically conductive die attach material 419. It is noted that heat spreading conductive plate 440 is configured to electrically couple source 424 of control FET 420 to drain 432 of sync FET 430, as well as to couple source 424 and drain 432 to switch node segment 410*a*. As a result, heat spreading conductive plate 440 and switch node segment 410*a* can be used to provide switch node contact 429. Heat spreading conductive plate 440 and switch node contact 429, in FIG. 4C, correspond respectively to heat spreading conductive plate 240 and switch node contact 229, in FIG. 2.

Figure 4D:
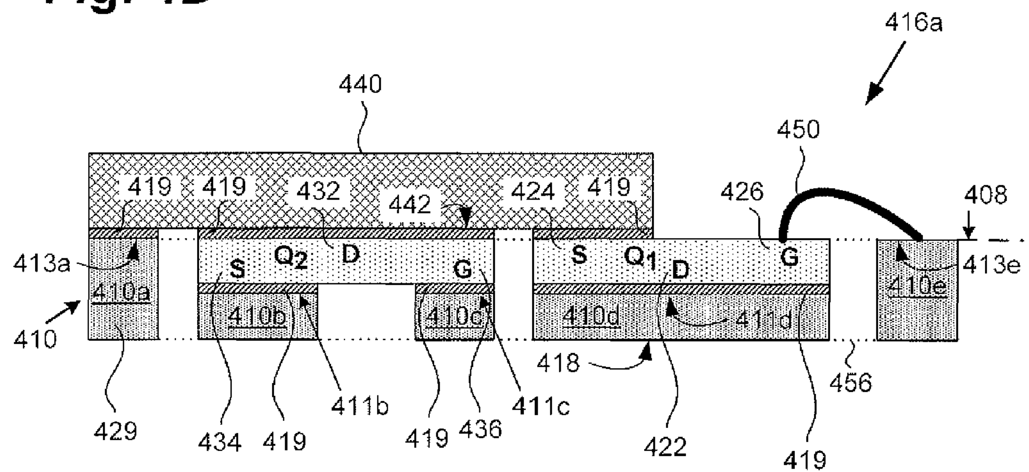
FIG. 4D illustrates a result of performing of a final action according to the flowchart of FIG. 3 in accordance with one implementation of the present disclosure.
Figure 4E:
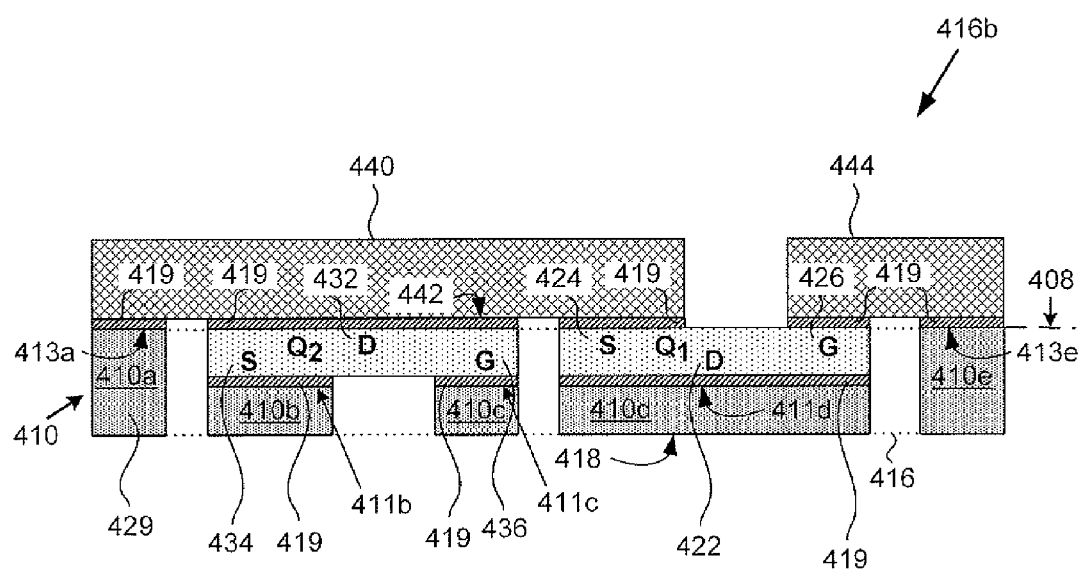
FIG. 4E illustrates a result of performing of the final action according to the flowchart of FIG. 3 in accordance with another implementation of the present disclosure.

Continuing to structure 416*a* in FIG. 4D, flowchart 300 continues with coupling gate 426 of control FET 420 to surface 413*e* on die receiving side 408 of segment 410*e* (action 316). As shown in FIG. 4D, in one implementation, coupling of gate 426 of control FET 420 to surface 413*e* of segment 410*e* may be accomplished through use of one or more bond wires 450 to couple gate 426 to segment 410*e*. One or more bond wires 450 may be gold (Au) or Cu bond wires, for example. One or more bond wires 450 correspond to one or more bond wires 250, in FIG. 2.

In other implementations, however, one or more bond wires 450 may be replaced by conductive ribbons or other connectors formed form conductive materials such as Al, Au, Cu, and/or other metals or composite materials. It is also noted that in some implementations, segment 410*e* may be a partially etched segment having a recessed surface, and thus may correspond to partially etched segments 410*b*, 410*c*, and 410*d* having respective surfaces 411*b*, 411*c*, and 411*d*.

As shown in structure 416*b* in FIG. 4E, in one alternate implementation, gate 426 of control FET 420 may be coupled to surface 413*e* on die receiving side 408 of segment 410*e* by heat spreading conductive plate 444. Heat spreading conductive plate 444 may be attached over gate 426 and over surface 413*e* of segment 410*e* using electrically conductive die attach material 419. Heat spreading conductive plate 444 may be formed of substantially the same materials as used to provide heat spreading conductive plate 440. Moreover, heat spreading conductive plate 444 may be situated and attached to control FET 420 and segment 410*e* substantially concurrently with attachment of heat spreading conductive plate 440 to source 424 of control FET 420, drain 432 of sync FET 430, and switch node segment 410*a*.

Figure 5:
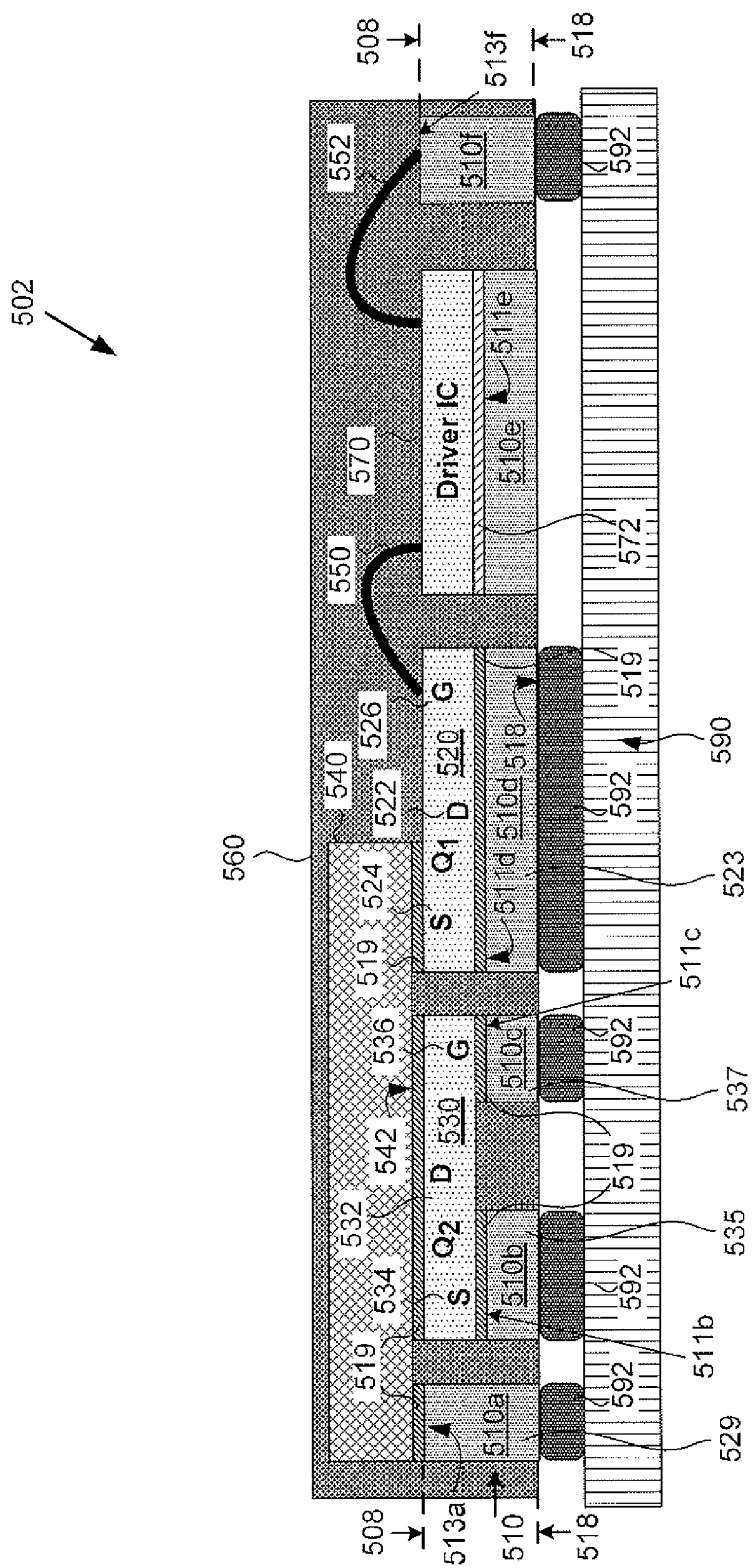
FIG. 5 shows an exemplary representation of a packaging solution according to yet another implementation of the present disclosure.

The implementations shown and described by reference to FIGS. 2, 3, and 4A-4E result in an MCM, such as semiconductor package 201, in FIG. 2, configured to enclose power switching stage 101*a*, in FIG. 1A. However, in some applications, it may be desirable to produce a semiconductor package corresponding to voltage converter MCM 102. An example implementation of such a voltage converter MCM package is shown by FIG. 5. One of ordinary skill in the art will readily understand that the exemplary method outlined by flowchart 300, in FIG. 3, can be suitably adapted to produce the exemplary voltage converter MCM package structure shown in FIG. 5.

FIG. 5 shows a cross-sectional view of semiconductor package 502 attached to mounting surface 590, which may be a PCB for example, by solder bodies 592. Semiconductor package 502 includes patterned conductive carrier 510, which itself includes conductive carrier segments 510*a*, 510*b*,

510*c*, 510*d*, 510*e*, and 510*f* (hereinafter "segments 510*a*-510*f*"). It is noted that patterned conductive carrier 510 includes partially etched segments 510*b*, 510*c*, 5210*d*, and 510*e*, which may be half-etched, for example, as well as segments 510*a* and 510*f*, which may be substantially non-etched. It further noted that in some implementations, segment 510*f* may be a partially etched segment having a recessed surface, and thus may correspond to partially etched segments 510*b*, 510*c*, 510*d*, and 510*e* having respective surfaces 511*b*, 511*c*, 511*d*, and 511*e*.

As shown in FIG. 5, patterned conductive carrier 510 may be a non-contiguous conductive carrier, made up of patterned and disjointed segments 510*a*-510*f* that are housed within semiconductor package 502, and that are in electrical communication only through conductive traces and routing on or within mounting surface 590. As further shown in FIG. 5, conductive carrier 510 has die receiving side 508, and opposite I/O side 518 connecting semiconductor package 502 to mounting surface 590.

Semiconductor package 502 also includes control FET 520 ($Q_1$) having drain 522, source 524, and gate 526, as well as sync FET 530 ($Q_2$) having drain 532, source 534, and gate 536. As shown in FIG. 5, drain 522 of control FET 520 is attached to surface 511*d* on die receiving side 508 of partially etched segment 510*d* by electrically conductive die attach material 519. In addition, source 534 and gate 536 of sync FET 530 are similarly attached to respective surfaces 511*b* and 511*c* on die receiving side 508 of respective partially etched segments 510*b* and 510*c*. Also shown in FIG. 5 is heat spreading conductive plate 540. Heat spreading conductive plate 540 is attached to source 524 of control FET 520, drain 532 of sync FET 530, and surface 513*a* on die receiving side 508 of segment 510*a* by electrically conductive die attach material 519. Semiconductor package 502 also includes driver IC 570 for driving at least one of control FET 520 and sync FET 530.

Also included as part of semiconductor package 502 are drain contact 523 provided by partially etched segment 510*d*, source contact 535 provided by partially etched segment 510, and gate contact 537 provided by partially etched segment 510*c*. In addition, segment 510*a* of patterned conductive carrier 510 (hereinafter "switch node segment 510*a*") and heat spreading conductive plate 540 provide switch node contact 529 of semiconductor package 502. FIG. 5 also shows one or more bond wires 550 coupling gate 526 of control FET 520 to driver IC 570, one or more bond wires 552 electrically coupling driver IC 570 to surface 513*f* on die receiving side 508 of segment 510*f*, overmolding or encapsulation material 560 for semiconductor package 502, and die attach material 572. It is noted that die attach material 572, which may be an electrically conductive die attach material or a dielectric die attach material, is used to attach driver IC 570 to surface 511*e* on die receiving side 508 of partially etched segment 510*e*. It is reiterated that in some implementations, segment 510*f* may be a partially etched segment having a recessed surface to which driver IC 570 is electrically coupled.

Partially etched segment 510*d*, control FET 520, partially etched segments 510*b* and 510*c*, sync FET 530, switch node segment 510*a*, and electrically conductive die attach material 519 correspond respectively to partially etched segment 210*d*, control FET 220, partially etched segments 210*b* and 210*c*, sync FET 230, switch node segment 210*a*, and electrically conductive die attach material 219, in FIG. 2. In addition, heat spreading conductive plate 540, contacts 523, 529, 535, and 537, one or more bond wires 550, and overmolding or encapsulation material 560, in FIG. 5, correspond respectively to heat spreading conductive plate 240, contacts 223, 229, 235, and 237, one or more bond wires 250, and overmolding or encapsulation material 260, in FIG. 2. Moreover, it is noted that semiconductor package 502 including driver IC 570, in FIG. 5, corresponds in general to voltage converter MCM 102 including driver IC 170, in FIG. 1.

According to the implementation shown in FIG. 5, heat spreading conductive plate 540 and switch node segment 510*a* are configured to advantageously provide switch node contact 529 and to concurrently provide integrated heat spreading functionality for dissipation of heat generated by control and sync FETs 520 and 530. Moreover, in addition to providing drain contact 523, partially etched segment 510*d* is configured to sink heat produced by control FET 520 into mounting surface 590, while partially etched segment 510*b* is configured to sink heat produced by sync FET 530 into mounting surface 590 as well as to provide source contact 535.

Thus, utilizing partially etched or half-etched segments in a patterned conductive carrier, along with a heat spreading conductive plate implemented as a switch node connection capable of providing integrated heat spreading, enable a highly compact semiconductor package, while concurrently providing thermal protection. For example, the package height, or the package thickness, resulting from the implementations disclosed in the present application may be less than approximately 0.5 mm, such as a package height or thickness of approximately 0.45 mm. Furthermore, using partially etched or half-etched segments in a patterned conductive carrier, along with a heat spreading conductive plate to provide a switch node connection, advantageously enable omission of a conductive clip having a vertical support leg, as well as a discrete heat spreader, from the semiconductor package.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package comprising:

a patterned conductive carrier;

a control FET having a control drain attached to a first partially etched segment of said patterned conductive carrier;

a sync FET having a sync source and a sync gate attached to respective second and third partially etched segments of said patterned conductive carrier;

a heat spreading conductive plate situated over a control source of said control FET and over a sync drain of said sync FET so as to couple said control source and said sync drain to a switch node segment of said patterned conductive carrier.

2. The semiconductor package of claim 1, wherein said first, second, and third partially etched segments are substantially half-etched.

3. The semiconductor package of claim 1, wherein said control FET and said sync FET form a power switching stage of a voltage converter.

4. The semiconductor package of claim 1, wherein said heat spreading conductive plate comprises a substantially flat metal plate.

5. The semiconductor package of claim 1, wherein said control source, said sync drain, and a top surface of said switch node segment are substantially coplanar.

6. The semiconductor package of claim 1, wherein said patterned conductive carrier comprises at least a portion of a lead frame.

7. The semiconductor package of claim 1, wherein said control FET and said sync FET comprise silicon FETs.

8. The semiconductor package of claim 1, wherein said control FET and said sync FET comprise III-Nitride FETs.

9. The semiconductor package of claim 1, wherein a control gate of said control FET is coupled to another segment of said patterned conductive carrier.

10. The semiconductor package of claim 9, wherein said another segment is another partially etched segment.

11. A method for fabricating a semiconductor package, said method comprising:

providing a patterned conductive carrier;

attaching a control drain of a control FET to a first partially etched segment of said patterned conductive carrier;

attaching a sync source and a sync gate of a sync FET to respective second and third partially etched segments of said patterned conductive carrier;

situating a heat spreading conductive plate over a control source of said control FET and over a sync drain of said sync FET, said heat spreading conductive plate coupling said control source and said sync drain to a switch node segment of said patterned conductive carrier.

12. The method of claim 11, wherein said first, second, and third partially etched segments are substantially half-etched.

13. The method of claim 11, wherein said control FET and said sync FET form a power switching stage of a voltage converter.

14. The method of claim 11, wherein said heat spreading conductive plate comprises a substantially flat metal plate.

15. The method of claim 11, further comprising coupling a control gate of said control FET to another segment of said patterned conductive carrier.

16. The method of claim 15, wherein said another segment is another partially etched segment.

17. A semiconductor package comprising:

a patterned conductive carrier;

a control FET having a control drain attached to a first partially etched segment of said patterned conductive carrier;

a sync FET having a sync source and a sync gate attached to respective second and third partially etched segments of said patterned conductive carrier;

a heat spreading conductive plate situated over a control source of said control FET and over a sync drain of said sync FET so as to couple said control source and said sync drain to a switch node segment of said patterned conductive carrier;

a driver integrated circuit (IC) for driving at least one of said control FET and said sync FET, said driver IC attached to a fourth partially etched segment of said patterned conductive carrier.

18. The semiconductor package of claim 17, wherein said first, second, third, and fourth partially etched segments are substantially half-etched.

19. The semiconductor package of claim 17, wherein said driver IC is electrically coupled to another segment of said patterned conductive carrier.

20. The semiconductor package of claim 17, wherein said control FET and said sync FET form a power switching stage of a voltage converter.

* * * * *